United States Patent [19]

Yarbrough et al.

[11] Patent Number: 4,947,058

[45] Date of Patent: Aug. 7, 1990

[54] TTL CURRENT SINKING CIRCUIT WITH TRANSIENT PERFORMANCE ENHANCEMENT DURING OUTPUT TRANSITION FROM HIGH TO LOW

[75] Inventors: Roy L. Yarbrough, Hiram; Julio R. Estrada, South Portland, both of Me.

[73] Assignee: Fairchild Semiconductor Corporation, Santa Clara, Calif.

[21] Appl. No.: 202,237

[22] Filed: Jun. 3, 1988

[51] Int. Cl.$^5$ .................. H03K 17/16; H03K 19/013
[52] U.S. Cl. ............................ 307/443; 307/454; 307/456; 307/543; 307/546; 307/547
[58] Field of Search ............... 307/443, 454, 456, 263, 307/543, 546, 547

[56] References Cited

U.S. PATENT DOCUMENTS 4,777,391 10/1988 Shin .................................. 307/263

Primary Examiner—Stanley D. Miller
Assistant Examiner—Margaret Rose Wambach
Attorney, Agent, or Firm—Lee Patch; Daniel H. Kane

[57] ABSTRACT

A transient voltage difference circuit is coupled into a TTL current sinking output circuit for transient performance enhancement during transition from high to low level potential at the output. The TTL output circuit includes a pulldown transistor element for sinking current from an output node to low potential, a base drive transistor for driving the base of a current sinking pulldown transistor element, an input base node of the base drive transistor coupled to receive input signals of high and low level potential, and a voltage clamp network coupled between the input base node and low potential for maintaining a potential level at the input base node sufficient to turn on the base drive transistor. An RC network is coupled between the input base node and low potential. The resistance of the RC network is coupled in series with the voltage clamping network adding a transient overdrive voltage in series with the clamping voltage at the input base node when the capacitance of the RC network is charging through the resistance during transition from low to high level potential at the input. The RC network and the voltage clamp network effectively form a Y network with the common branch coupled to the input base node through the resistance.

16 Claims, 2 Drawing Sheets

TTL CURRENT SINKING CIRCUIT WITH TRANSIENT PERFORMANCE ENHANCEMENT DURING OUTPUT TRANSITION FROM HIGH TO LOW

TECHNICAL FIELD

The present invention relates to an improvement in TTL circuits incorporating a TTL output sinking transistor element. The invention speeds up the high to low transition at the TTL circuit output by providing a transient overdrive voltage signal at the base drive for the output current sinking transistor element. The transient performance enhancement is accomplished without increasing steady state power dissipation.

BACKGROUND ART

Typical TTL circuits incorporating a pulldown transistor element for sinking current from an output node include TTL buffers, TTL output gates or devices, TTL to ECL and ECL to TTL translators, etc. A prior art TTL output device or output circuit 10 is illustrated in FIG. 1. The circuit is characterized by a pulldown transistor element Q5 which sinks current from an output node $V_o$ to ground or low potential. The circuit may also include a pullup element Z which is controlled for sourcing current from the high potential TTL power supply $V_{cc}$ through a resistance or impedance to the output node $V_o$.

With respect to the pullup element Z, three configurations of TTL output circuits may generally be identified. First, in the case of an active transistor pullup element such as a Darlington transistor pair, the pullup and pulldown transistor elements form a totem pole output which may be controlled with or without a phase splitter. Second, in the illustrated example of FIG. 1 the pullup element is a passive pullup element for example such as a resistance or reactance. Third, the circuit may be fabricated with an open collector at the pullup location and the user provides the pullup element, for example a passive pullup element Z from related circuitry.

The base drive transistor Q4 controls the conducting state of the pulldown transistor element Q5 and the sourcing of current through the pullup element Z. The pulldown transistor Q5 and pullup element Z are generally in opposite conducting states. In the case of an active totem pole configuration of active pullup and pulldown transistor elements at the output the base drive transistor Q4 may be configured as a phase splitter transistor. In the example of FIG. 1 the base drive transistor Q4 is an emitter follower transistor controlling the conducting state of the pulldown transistor Q5. As shown in FIG. 1, when Q5 is on there is current flow through Z into Q5 to ground.

The base of transistor Q4 is coupled to the input $V_{IN}$ through diode D1 at the input base node A. The diode connected transistors Q1, Q2 and Q3 coupled in series form a clamping network between the input base node A and low potential to hold the base of transistor Q4 at a voltage level sufficiently high to turn on Q4 when a high level potential signal appears at the input $V_{IN}$. When a logic high level signal appears at the input node $V_{IN}$, the TTL power supply $V_{cc}$ or high potential delivers base drive current through resistor R1 to transistor Q4. When base drive transistor Q4 is conducting, sourcing current is diverted from the pullup element Z through the collector to emitter path of emitter follower base drive transistor Q4 turning on the pulldown transistor element Q5 with base drive current through resistor R2. The pulldown transistor element Q5 sinks current from the output node $V_o$ so that the output is at logic low level potential.

When a logic low level signal appears at the input node $V_{IN}$ transistor Q4 is deprived of base drive current and turns off. The pulldown transistor Q5 turns off and the pullup element Z sources current to the output $V_o$ so that the output is at the logic high level potential. The illustrated TTL output circuit of FIG. 1 is therefore inverting.

During transition from low to high level potential at the input $V_{IN}$, the voltage $V_A$ at input base Node A rises at a rate depending on the resistance value of R1 and the capacitance associated with junctions at Node A as illustrated by way of example in FIGS. 2A and 2B. The delay in the rise of voltage $V_A$ at Node A combined with delays associated with the capacitance of the output node $V_o$ and output load result in a total time delay TD in the transition from high to low potential at the output $V_o$ as shown in FIG. 2C. In order to increase the speed of the high to low transition at the output the resistance of R1 must be decreased in value with the accompanying disadvantage of larger steady state power consumption.

OBJECTS OF THE INVENTION

It is therefore an object of the present invention to provide an improved TTL current sinking circuit with enhanced speed during high to low transition at the output without increasing steady state power dissipation by the TTL circuit.

Another object of the invention is to provide a TTL output current sinking circuit with transient performance enhancement by providing transient overdrive voltage during transition from logic low to high level potential at the input and logic high to low level potential at the output.

A further object of the invention is to provide transient performance enhancement in TTL integrated circuits optimizing component parameters available from bipolar junction wafer fabrication.

DISCLOSURE OF THE INVENTION

In order to accomplish these results the present invention provides an improvement in TTL current sinking circuits having an output current sinking transistor element, an input base node for driving the output transistor current sinking element in response to high and low level potential input signals at the input base node, and a voltage clamp network operatively coupled between the input base node and low potential for maintaining a clamping voltage level at the input base node. According to the invention a transient voltage difference element is operatively coupled in series with the voltage clamp network. The transient voltage difference element is constructed and arranged to add a transient potential difference to the clamp voltage and transiently increase base drive voltage at the input base node A during transition from low to high level potential at the input. An advantage of this arrangement is that the transient overdrive voltage or enhanced base drive voltage accelerates the transition from high to low level potential at the output node without increasing steady state power consumption.

The present invention is generally applicable in TTL circuits having a pulldown transistor element for sinking current from an output node to low potential and a base drive transistor having an emitter operatively coupled for driving the base of the current sinking pulldown transistor element. The base of the base drive transistor is operatively coupled to receive input signals of high and low level potential at the input base node. The conventional voltage clamp is generally coupled between the input base node and low potential for clamping the potential at the input base node at a level sufficient for turn on of the base drive transistor when a logic high level signal appears at the input.

According to a preferred example embodiment, the transient voltage difference element is provided by an RC network in which the resistance is operatively coupled to provide a potential difference in series with the potential difference of the voltage clamp between the input base node and low potential. The capacitance of the RC network is operatively coupled between the resistance and low potential so that the capacitance charges through the resistance of the RC network during transition at the input base node from low to high level potential.

A feature and advantage of this circuit arrangement is that a voltage drop appears across the resistance of the RC network only during the transition from low to high level potential at the input base node. The transient voltage drop establishes the transient voltage enhancement above the level of the clamp voltage at the input base node for transient speed up and enhancement of the transition from high to low level potential at the output node.

According to the preferred example embodiment, the capacitance of the RC network is provided by a diode connected transistor and in particular a collector emitter shorted diode connected transistor. The common collector emitter node is coupled to the resistance of the RC network while the base is coupled to low potential thereby maximizing capacitance available from the junctions of the diode connected transistor device and limiting current flow through the device to the charging of the capacitance. The resistance of the RC network is coupled between the input base node and the capacitance and at the same time is coupled in series with the voltage clamping network.

The typical voltage clamp network comprises multiple diodes coupled in series to establish the desired voltage clamping level above low potential and the diodes may be for example diode connected transistors. In the preferred example embodiment a clamp transistor is coupled in series with the diode connected transistors with the base to emitter voltage drop $V_{BE}$ across the clamp transistor forming part of the voltage drop of the voltage clamp network. The base of the clamp transistor is coupled to the node between the resistance and capacitance of the RC network so that the resistance of the RC network is in series with the base to emitter voltage drop $V_{BE}$ across the clamp transistor and therefore in series with the potential difference of the voltage clamp. The transient voltage drop across the resistance of the RC network during transition from low to high level potential at the input therefore provides the transient enhancement of voltage at the input base node above the clamping voltage during the transient charging of the capacitance of the RC network.

Other objects, features and advantages are apparent in the following specification and accompanying drawings.

DESCRIPTION OF PREFERRED EXAMPLE EMBODIMENTS & BEST MODE OF THE INVENTION

Figure 1:
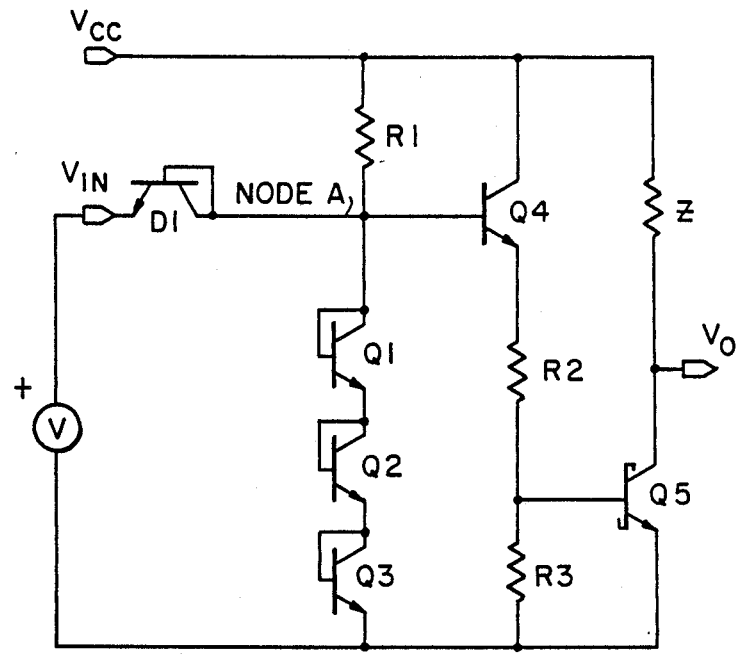
FIG. 1 is a schematic circuit diagram of a generalized prior art TTL output circuit.
Figure 3:
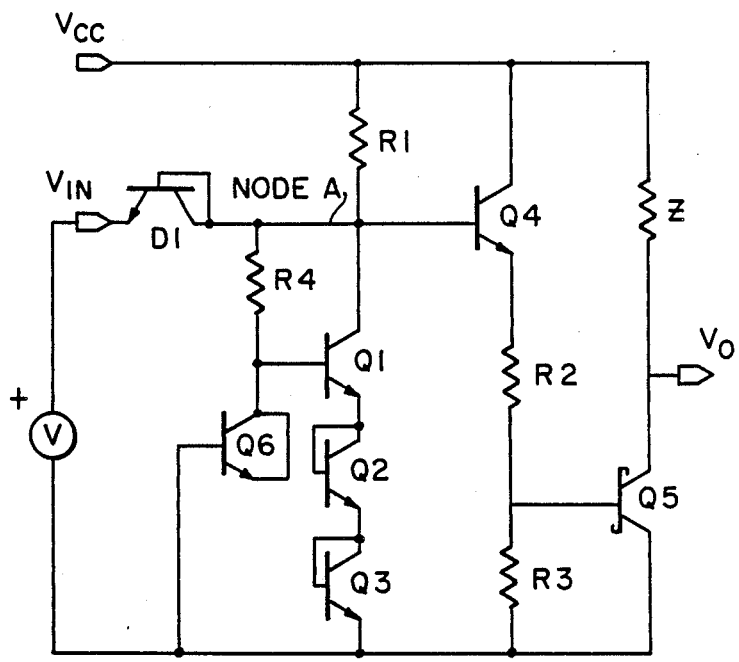
FIG. 3 is a schematic circuit diagram of the improved TTL output circuit with transient performance enhancement according to the invention.

An improved TTL output circuit incorporating the transient performance enhancement of the present invention is illustrated in FIG. 3. Components performing the same functions as those illustrated in the TTL output circuit of FIG. 1 are identified by the same reference designations. In addition there is added the transient performance enhancement RC network identified by resistor R4 and the diode connected or junction connected transistor Q6. Resistor R4 and transistor Q6 provide the resistance and capacitance respectively of the RC network. Transistor Q6 is connected with the collector and emitter shorted at a common node connected to transistor R4 so that transistor Q6 acts as a capacitor. Furthermore the collector emitter shorted coupling maximizes the capacitance available from the PN junctions of the integrated circuit transistor device.

The capacitor device Q6 is charged through resistor R4 by the transient charging current that is generated during transition from low to high level potential at input base node A. The transient voltage drop across R4 is the overdrive voltage above the clamp voltage that appears at node A during the transition. When the capacitance of capacitor device Q6 is fully charged, the transient capacitance charging current and the transient voltage drop across resistor R4 return to zero. No further enhancing voltage drop is created across resistor R4 and the voltage level $V_A$ at input base node A returns to the clamping voltage level. The clamping voltage level at node A is approximately 3 $V_{BE}$ across the base emitter junctions of diode connected transistors Q1, Q2, and Q3, neglecting the voltage drop produced by the base current of Q1 through R4, as compared to the voltage drop of $V_{BE}$.

Figure 2A:
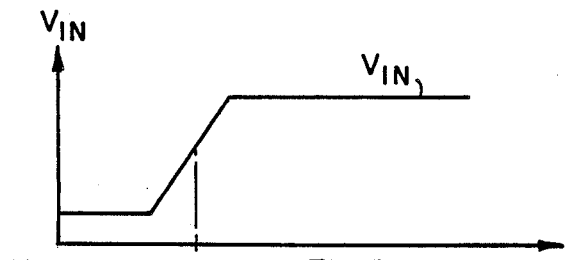
FIGS. 2A, 2B and 2C are diagrammatic graphs respectively of the voltage at the input $V_{IN}$, the voltage $V_A$ at input base node A and the voltage level at the output $V_o$ versus time for the prior art TTL output circuit of FIG. 1.
Figure 2B:
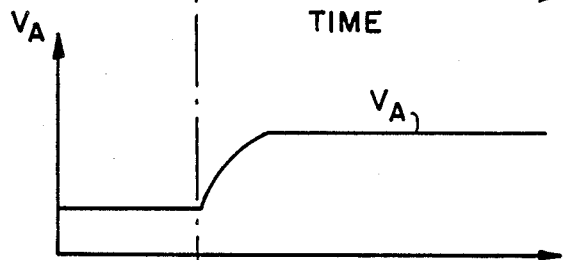
Figure 2C:
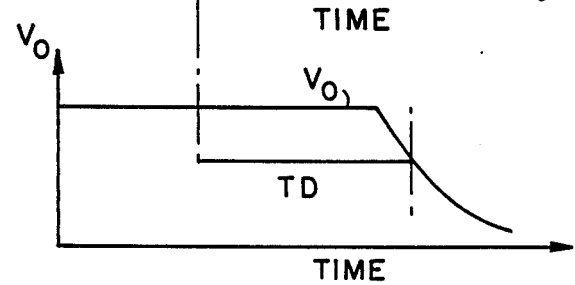
Figure 4A:
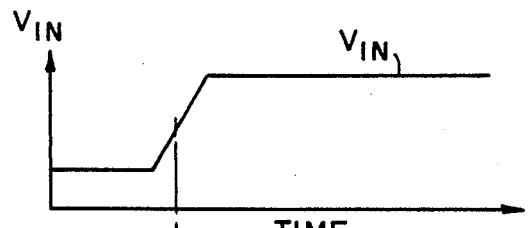
FIGS. 4A, 4B and 4C are diagrammatic graphs respectively of the voltage level at the input $V_{IN}$, voltage level $V_A$ at input base node A, and voltage level at the output $V_o$ for the improved TTL output circuit of FIG. 3.
Figure 4B:
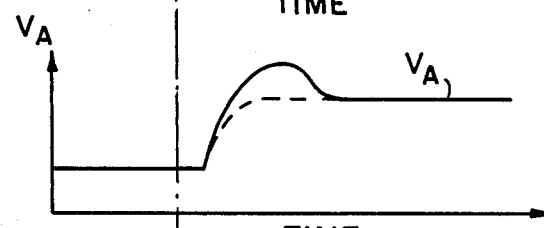
Figure 4C:
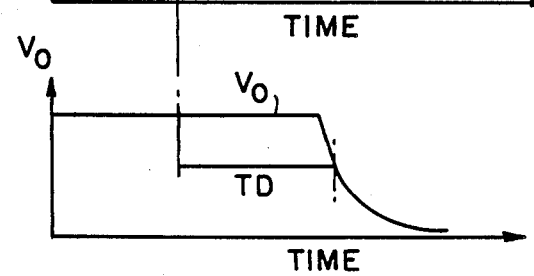

The transient voltage spike or transient overdrive voltage in the voltage level $V_A$ appearing at input node A during transition from low to high level voltage at the input $V_{IN}$ is illustrated in FIGS. 4A and 4B. As a result of the transient overdrive voltage spike in the base drive voltage to base drive transistor Q4, the transition time that is the total delay time TD in transition from high to low level voltage at the output $V_o$ illustrated in FIG. 4C is decreased in comparison with the transition time and total delay time of the prior art TTL output circuit as illustrated in FIG. 2C.

By way of example, the transition speed from high to low level potential at the output is increased and the time delay reduced by 1.2 ns at 0° C. and 27° C. and by 1.7 ns at 125° C. in the ciruit of FIG. 3 with typical values for the RC network of R4=10K and the capacitance of Q6 of 3-5 pf. The transient charging current $I_T$ charging Q6 produces a transient overdrive voltage of $R4I_T$ in the order of, for example, 1 to 2 $V_{BE}$ over the clamp voltage. The peak $V_A$ at input base node A is therefore approximately 3.2 to 4 volts. The parameters of the RC network and the time constant of the RC network may of course be selected according to the speed of the device and the amount of transient overdrive required. For example, a greater transient overdrive voltage may be required for TTL circuits with larger output loads.

In the example of FIG. 3 one of the diode connected transistors of the series diode clamping network is modified to accommodate the resistance R4 of the RC network in series with the voltage drops of the voltage clamp. As shown in FIG. 3 the diode connection of transistor Q1 is modified to provide a clamp transistor with the base of transistor Q1 coupled at a node between the resistance R4 and capacitance Q6 of the RC network. As a result, the resistor R4 of the RC network is coupled in series with the base to emitter voltage drops $V_{BE}$ of the respective transistors Q1, Q2 and Q3. At the same time the resistor R4 is also coupled in series with the capacitor device Q6 between the input base node A and low potential.

By this arrangement of the voltage clamping network with a clamp transistor Q1 in series with diode connected resistors Q2 and Q3, the RC network and voltage clamp network together effectively provide a "Y" network through resistor R4 to the input base node A. A transient charging current flows through one arm of the Y charging the capacitor device Q6 and establishing the transient voltage drop across resistor R4. The enhanced overdrive voltage level $V_A$ at input base node A is established through the other branch of the Y through the voltage drops across R4 and 3 $V_{BE}$'s of transistors Q1, Q2 and Q3.

While the invention has been described with reference to particular example embodiments it is applicable to the full range of TTL circuits incorporating a pulldown transistor or output current sinking transistor. The invention is therefore intended to cover all modifications and equivalents within the scope of the following claims.

We claim:

1. In a TTL current sinking circuit having an output current sinking transistor means for sinking current from an output node, an input base drive transistor element coupled for driving the output current sinking transistor means in response to high and low level potential input signals at an input base node of the input base drive transistor element, and a voltage clamping network operatively coupled between the input base node and low potential for maintaining a clamping voltage level at the input base node, the improvement comprising:

transient voltage difference component means operatively coupled in series with the voltage clamping network, said transient voltage difference component means being coupled directly to the input base node and being constructed and arranged to add a transient potential difference to the voltage clamping network and transiently increase the voltage at the input base node to a level above the clamping voltage level during transition from low to high level potential at the input base node for speeding up transition from high to low level potential at the output node.

2. The TTL current sinking circuit of claim 1 wherein the transient voltage difference component means comprises an RC network having a resistor directly coupled to said input base node in series with the voltage clamping network and a capacitor operatively coupled between the resistor and low potential, said RC network and voltage clamping network forming a Y network with a common first branch coupled through said resistor of the RC network to the input base node and separate second and third branches coupled to low potential through the capacitor of the RC network and through the voltage clamping network respectively.

3. A transient performance enhancement circuit for TTL current sinking circuits having TTL output current sinking transistor means for sinking current from an output node, an input base drive transistor element coupled for driving the output current sinking transistor means in response to high and low level potential input signals at an input base node, and voltage clamp means operatively coupled between the input base node and low potential establishing a clamping voltage at the input base node, the improvement comprising:

transient voltage drop component means and transient current generating component means coupled in series between the input base node and low potential, said transient voltage drop component means being operatively coupled directly to said input base node and in series with the voltage clamp means, said transient current generating component means being constructed and arranged to generate a transient current across the transient voltage drop component means during transition from low to high level potential at the input base node, said transient voltage drop component means providing a transient overdrive voltage at the input base node above the clamping voltage when transient current is generated by the transient current generating component means for enhancing speed of transition from high to low level potential at the output node.

4. The transient performance enhancement circuit of claim 3 wherein the transient current generating component means comprises a capacitor and the transient voltage drop component means comprises a resistor, said resistor and capacitor forming an RC network, said RC network and voltage clamping network forming a Y network with a common first branch coupled through said resistor of the RC network to the input base node and separate second and third branches coupled to low potential through the capacitor of the RC network and through the voltage clamping network respectively.

5. A TTL current sinking circuit having an output current sinking transistor element for sinking current from an output node to low potential, a base drive transistor element operatively coupled for driving the base of the current sinking transistor element, said base drive transistor element having an input base node coupled to receive input signals of logic high and low level potential, and a voltage clamp network coupled between the input base node and low potential for maintaining a clamping voltage potential level at the input base node sufficient to turn on the base drive transistor element, the improvement for transient performance enhancement of the speed of transition from high to low level potential at the output comprising:

RC network means operatively coupled between said input base node and low potential, said RC network means comprising a resistor and capacitor coupled in series, said resistor being coupled directly to the input base node and in series with the voltage clamping network for adding a transient overdrive voltage in series with the clamping voltage at the input base node when the capacitor of the RC network means is charging through the resistor during transition from low to high level potential at the input base node.

6. The TTL current sinking circuit of claim 5 wherein the capacitor of the RC network means comprises a diode connected transistor coupled between the resistor of the RC network means and low potential.

7. The TTL current sinking circuit of claim 6 wherein the diode connected transistor comprises a collector emitter shorted transistor with a common collector emitter node coupled to the resistor of the RC network means and with a base node coupled to low potential.

8. The TTL current sinking circuit of claim 5 wherein the voltage clamping network comprises a plurality of series coupled diode means.

9. The TTL current sinking circuit of claim 8 wherein the diode means of the voltage clamping network comprises at least one diode connected transistor and wherein the voltage clamping network further comprises a transistor element in series with the diode means, said transistor element having a base node operatively coupled to the node between the series coupled resistor and capacitor of the RC network means so that the resistor coupled to the input base node is in series with the voltage clamping network transistor element and diode means.

10. In a TTL circuit having a pulldown transistor element for sinking current from an output node to low potential, base drive transistor means having an emitter node operatively coupled for driving the base of the current sinking pulldown transistor element and an input base node operatively coupled to receive input signals of high and low level potential, and voltage clamp means operatively coupled between said input base node and low potential for clamping the potential at said input base node at a clamping voltage level sufficient for turn on of the base drive transistor means, the improvement for speeding up the transition from high to low level potential at the output comprising:

RC network means comprising a resistor directly coupled to the input base node and in series with the voltage clamp means between said input base node and low potential, and a capacitor operatively coupled between the resistor and low potential whereby the capacitor charges through the resistor of the RC network means during transition at said input base node from low to high level potential establishing a transient voltage enhancement above the clamping voltage level of the voltage clamp means at the input base node for transient speed up of the transition from high to low level potential at the output node, said voltage clamp means comprising a plurality of voltage drop means coupled in series including a clamp transistor element coupled in said series of voltage drop means, said clamp transistor element having a base node coupled between the resistor and capacitor of the RC network means.

11. The TTL current sinking circuit of claim 10 further comprising an active pullup transistor element operatively coupled for sourcing current from high potential to the output node and wherein the base drive transistor means comprises a phase splitter transistor element operatively coupled for controlling the conducting states of the pullup and pulldown transistor elements.

12. The TTL current sinking circuit of claim 10 further comprising a passive pullup transistor element operatively coupled for sourcing current from high potential to the output node and wherein said base drive transistor means comprises an emitter follower configuration.

13. The TTL current sinking circuit of claim 10 wherein the capacitor of the RC network means comprises a diode connected transistor.

14. The TTL current sinking circuit of claim 13 wherein the diode connected transistor comprising the capacitor of the RC network means is a collector emitter shorted diode connected transistor with a common collector emitter node coupled to the resistor of the RC network means and a base node coupled to low potential.

15. In a TTL current sinking circuit having output current sinking transistor means for sinking current from an output node, an input base drive transistor element coupled for driving the output transistor current sinking means in response to high and low level potential input signals at an input base node, and a voltage clamping network operatively coupled between the input base node and low potential for maintaining a clamping voltage level at the input base node the improvement comprising:

a resistor and capacitor operatively coupled in series between the input base node and low potential forming an RC network with the resistor directly coupled to the input base node, said resistor being coupled in series with the voltage clamping network for providing a transient overdrive voltage above the clamping voltage level at the input base node during transient charging of the capacitor for increasing speed of transition from high to low level potential at the output node.

16. The TTL current sinking circuit of claim 15 wherein the RC network and the voltage clamping network form a Y network with a common first branch coupled through the resistor of the RC network to the input base node and with separate second and third branches coupled to low potential respectively through said RC network capacitor and said voltage clamping network.

* * * * *